(12) United States Patent
Park

(10) Patent No.: US 11,798,599 B2
(45) Date of Patent: Oct. 24, 2023

(54) EFFICIENT PLACEMENT OF MEMORY

(71) Applicant: HEWLETT-PACKARD DEVELOPMENT COMPANY, L.P., Spring, TX (US)

(72) Inventor: Jung Soo Park, Pangyo (KR)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 17/763,813

(22) PCT Filed: Oct. 15, 2020

(86) PCT No.: PCT/US2020/055724
§ 371 (c)(1),
(2) Date: Mar. 25, 2022

(87) PCT Pub. No.: WO2021/076721
PCT Pub. Date: Apr. 22, 2021

(65) Prior Publication Data
US 2022/0358969 A1    Nov. 10, 2022

(30) Foreign Application Priority Data
Oct. 16, 2019  (KR) .................. 10-2019-0128364

(51) Int. Cl.
*G11C 5/02*   (2006.01)
*G11C 7/10*   (2006.01)
*G11C 8/12*   (2006.01)

(52) U.S. Cl.
CPC ............ *G11C 5/025* (2013.01); *G11C 7/1057* (2013.01); *G11C 7/1084* (2013.01); *G11C 8/12* (2013.01)

(58) Field of Classification Search
CPC ..... G11C 5/025; G11C 7/1057; G11C 7/1084; G11C 8/12
USPC ............................................. 365/51
See application file for complete search history.

(56) References Cited

U.S. PATENT DOCUMENTS

| | | | |
|---|---|---|---|
| 8,582,388 B1 * | 11/2013 | Hu | G11C 5/143 365/228 |
| 9,425,192 B2 * | 8/2016 | Rahim | H01L 27/0805 |
| 9,665,315 B2 * | 5/2017 | Sato | G06F 3/1228 |
| 2003/0206479 A1 | 11/2003 | Shiah et al. | |
| 2009/0039917 A1 | 2/2009 | Madurawe | |
| 2010/0148304 A1 | 6/2010 | Rahim et al. | |

(Continued)

FOREIGN PATENT DOCUMENTS

| | | |
|---|---|---|
| CN | 101753008 A | 6/2010 |
| CN | 102396030 A | 3/2012 |

(Continued)

*Primary Examiner* — Huan Hoang
(74) *Attorney, Agent, or Firm* — Brooks, Cameron & Huebsch, PLLC

(57) ABSTRACT

An electronic apparatus includes a circuit board, a memory chip mounted on the circuit board, a memory controller to control an operation of the memory chip, a conductive pattern including a first control line to connect from a first terminal of the memory chip to a first terminal of the memory chip and a second control line to connect from a second terminal of the memory controller to a second terminal of the memory chip, and a capacitive element to provide a termination voltage. The first control line is connected to the capacitive element and the second control line is not connected to the capacitive element.

14 Claims, 8 Drawing Sheets

(56) References Cited

U.S. PATENT DOCUMENTS

| | | |
|---|---|---|
| 2012/0175160 A1 | 7/2012 | Kadri et al. |
| 2014/0289434 A1 | 9/2014 | Ranganathan et al. |
| 2016/0092144 A1 | 3/2016 | Sato |
| 2018/0335828 A1 | 11/2018 | Chun et al. |
| 2019/0179704 A1 | 6/2019 | Niu et al. |
| 2019/0303332 A1 | 10/2019 | Yamada |
| 2019/0333556 A1* | 10/2019 | Yun .................. G11C 29/50012 |
| 2020/0313638 A1* | 10/2020 | Hong ........................ H03F 1/26 |

FOREIGN PATENT DOCUMENTS

| | | |
|---|---|---|
| CN | 103473186 A | 12/2013 |
| CN | 104956347 A | 9/2015 |
| CN | 110321308 A | 10/2019 |
| JP | 2006-318242 A | 11/2006 |
| JP | 2011-54219 | 3/2011 |
| JP | 2018-28910 | 2/2018 |
| JP | 2018-524751 | 8/2018 |
| WO | WO2014/133527 A1 | 9/2014 |

\* cited by examiner

EFFICIENT PLACEMENT OF MEMORY

CROSS REFERENCE TO RELATED APPLICATIONS

This application is a U.S. National Stage Application which claims the benefit under 35 U.S.C. § 371 of International Patent Application No. PCT/US2020/055724 filed on Oct. 15, 2020, which claims priority benefit from Korean Patent Application No. 10-2019-0128364 filed on Oct. 16, 2019, the contents of which are incorporated herein by reference.

BACKGROUND

An electronic apparatus is provided with a memory for driving an operating system. The memory and a controller are connected through a wire on a circuit board. Recently, there has been a demand for wire efficiency that secures additional space by removing components which do not affect the performance of the electronic apparatus, even when removing components which were previously disposed on a circuit board.

DETAILED DESCRIPTION

Examples will be described with reference to the accompanying drawings. Examples described below may be modified and implemented in various different forms.

The term "connected to" or "coupled to" that is used to designate a connection or coupling of one element to another element includes both a case that an element is "directly connected or coupled to" another element and a case that an element is connected or coupled to another element via still another element. Further, it should be understood that the term "includes" means that other constituent elements may be further included rather than excluding the other constituent elements unless specially mentioned on the contrary.

In the specification, a term "image forming job" may refer to various jobs (e.g., printing, scanning, or faxing) related to an image, such as forming an image or generating an image file, storing an image file, transmitting an image file, and the like. In addition, the term "job" may mean an image forming job, and also may include a series of processes for performing the image forming job.

In addition, an "electronic apparatus" may be a device having a volatile memory, and may be a personal computer (PC), a notebook computer, a tablet PC, a smartphone, an image forming apparatus, a scanner, or the like.

Further, the term "image forming apparatus" may mean a device that prints print data that is generated from a terminal device, such as a computer, on a recording paper. Examples of such an image forming apparatus may include a copy device, a printer, a facsimile, and a multi-function peripheral (MFP) that has multiple functions of the above-described devices in one unit.

Further, the term "print data" may mean data that is converted into a printable format in a printer.

Figure 1:
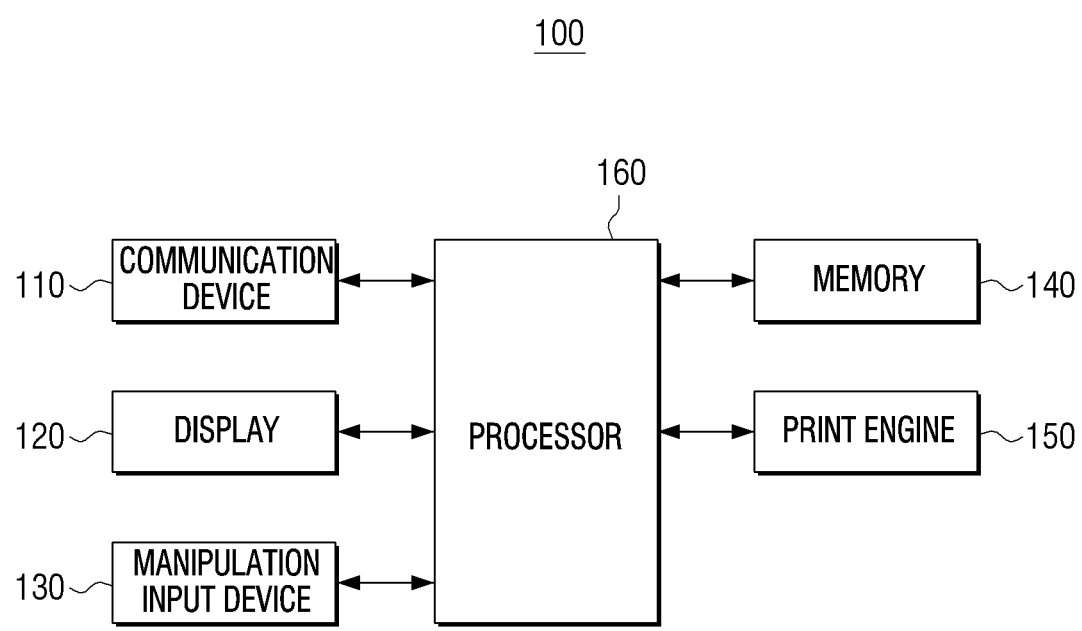
FIG. 1 is a block diagram illustrating an image forming apparatus according to an example.

FIG. 1 is a block diagram illustrating an image forming apparatus according to an example.

Referring to FIG. 1, the electronic apparatus 100 may include a communication device 110, a display 120, a manipulation input device 130, a memory 140, a print engine 150, and a processor 160.

The communication device 110 may be formed to connect the electronic apparatus 100 to an external device, and may be connected to a user terminal device through a local area network (LAN) and an internee network as well as through a universal serial bus (USB) port or wireless communication (e.g., Wi-Fi 802,11a/b/g/n, NFC, Bluetooth) port.

The communication device 110 may be connected to the user terminal device (not shown) and may receive print data from the user terminal device (not shown).

The display 120 may display various information provided by the electronic apparatus 100 or may display a control menu for performing a function of the electronic apparatus 100. For example, the display 120 may display a user interface window for selecting various functions provided in the electronic apparatus 100. The display 120 may be a monitor such as a liquid crystal display (LCD), a cathode ray tube (CRT), organic light emitting diodes (OLEDs), or the like, and may be implemented as a touch screen capable of simultaneously performing a function of the manipulation input device 130.

The manipulation input device 130 may receive an input of a user's function selection and a control command for the corresponding function. The function may include printing, copying, scanning, fax transmission, and the like. The manipulation input device 130 as described above may be input through a control menu that is displayed on the display 120.

The manipulation input device 130 may be implemented by a plurality of buttons, keyboards, and mouse, and may also be implemented by a touch screen that can simultaneously perform the function of the display 120.

At least one instruction related to the electronic apparatus 100 may be stored in the memory 140. For example, various programs (or software or machine readable instructions) for operating the electronic apparatus 100 may be stored in the memory 140 according to various examples of the disclosure.

In addition, the memory 140 may store received print data. The memory 140 may include volatile or non-volatile memory. The non-volatile memory may store a program as described above. The non-volatile memory may be implemented as various storage devices such as a hard disk drive (HDD), a solid state drive (SSD), or the like.

The volatile memory may operate by loading a program stored in the non-volatile memory while operating the processor 160 which will be described later. In the printing process of the print data, the volatile memory may temporarily store the received print data or store parsed data, binary data, and the like for the corresponding the print data. The volatile memory configuration of the memory 140 will be described later with reference to FIG. 3.

The print engine 150 may print print data. The print engine 150 may form an image on a recording medium by various printing methods such as an electro-photographic method, an inkjet method, a thermal transfer method, a thermal method, or the like. For example, the print engine 150 may print an image on the recording medium by a series of processes including exposure, development, transfer, and fixing. An example configuration of the print engine 150 will be described later with reference to FIG. 2.

The processor 160 may control each component of the electronic apparatus 100. For example, the processor 160 may be implemented as a central processing unit (CPU), a graphics processing unit (GPU), a ROM, or the like, may perform a booting operation for loading an operating system stored in the non-volatile memory into the volatile memory based on a program stored in the ROM, and may perform various services provided by the electronic apparatus 100 after the booting operation.

In addition, when receiving the print data from the outside, the processor 160 may control the print engine 150 to perform printing on the received print data by performing an operation such as parsing, or the like.

In FIG. 1, although the electronic apparatus 100 is described as including the print engine, other components may be included. For example, the electronic apparatus 100 may instead include, or may additionally include, a scan unit for performing a scan function, a fax transceiver for performing a fax transmission and/or reception function, or the like according to a function supported by the electronic apparatus 100. In addition, when the electronic apparatus 100 is implemented as a general PC, a smartphone, a tablet, or the like, the configuration of print engine 150 described above may be omitted.

Figure 2:
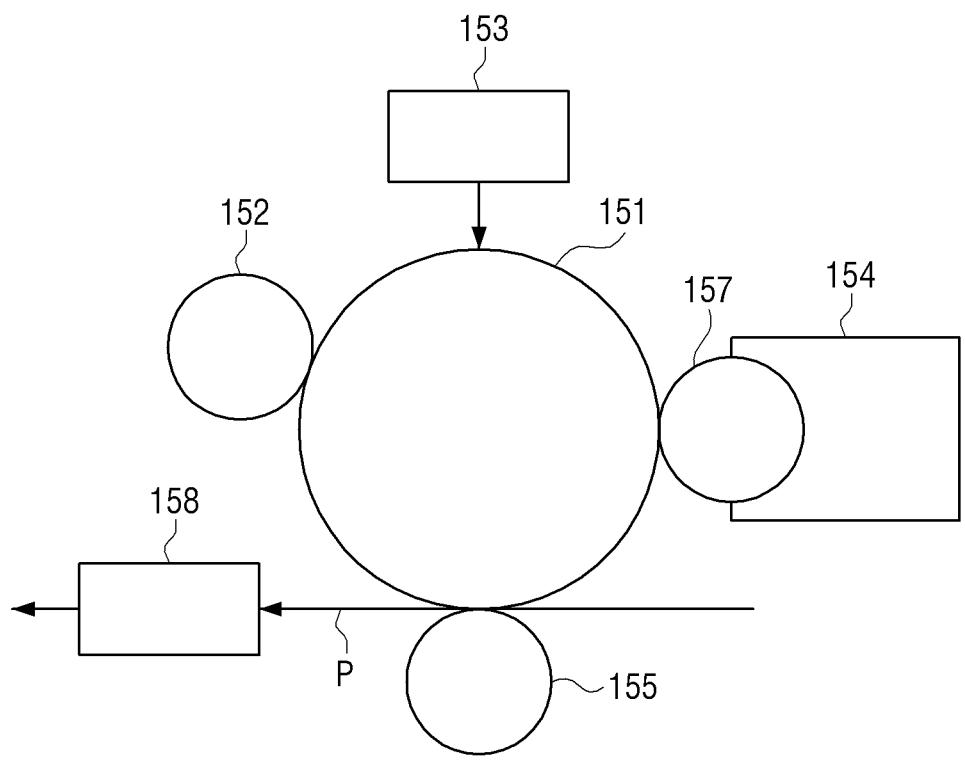
FIG. 2 is a view illustrating an example of a print engine of FIG. 1.

FIG. 2 is a view illustrating an example of the print engine of FIG. 1.

Referring to FIG. 2, the print engine 150 may include a photosensitive member 151, a charger 152, an exposure device 153, a developer 154, a transfer device 155, and a fuser 158.

The print engine 150 may further include a paper feeding device (not shown) for supplying a recording medium P (for example, paper). FIG. 1 An electrostatic latent image is formed on the photosensitive member 151. The photosensitive member 151 may be referred to as a photosensitive drum, a photosensitive belt, or the like depending on its shape.

The charger 152 may charge a surface of the photosensitive member 151 to a uniform electric potential. The charger 152 may be implemented in the form of a corona charger, a charging roller, a charging brush, or the like.

The exposure device 153 may form an electrostatic latent image on the surface of the photosensitive member 151 through changing of the surface potential of the photosensitive member 151 according to image information to be printed. As an example, the exposure device 153 may receive image information to be printed from the volatile memory and irradiate modulated light to the photosensitive member 151 according to the received image information to form the electrostatic latent image. This type of exposure device 153 may be referred to as a light syringe or the like, and an LED may be used as a light source.

The developer 154 may accommodate a developing agent therein, and develops the electrostatic latent image into a visible image through supply of the developing agent onto the electrostatic latent image. The developer 154 may include a developing roller 157 that supplies the developing agent onto the electrostatic latent image. For example, the developing agent may be supplied from the developing roller 157 onto the electrostatic latent image that is formed on the photosensitive member 151 by a developing electric field that is formed between the developing roller 157 and the photosensitive member 151.

The visible image that is formed on the photosensitive member 151 is transferred onto the recording medium P by the transfer device 155 or a middle transfer belt (not illustrated). For example, the transfer device 155 may transfer the visible image onto the recording medium through an electrostatic transfer method. The visible image is attached to the recording medium P by electrostatic attraction.

The fuser 158 may apply heat and/or pressure to the visible image on the recording medium P to fix the visible image to the recording medium P. The print job may be completed by such a series of processes.

The above-described developer is used whenever the image forming job is performed, and thus is drained after it is used over a predetermined time. In this case, a unit (e.g., the developer 154) that stores the developing agent should be replaced by a new one. A component or constituent element that can be replaced in the process of using the image forming apparatus is called a consumable unit or a replaceable unit.

Figure 3:
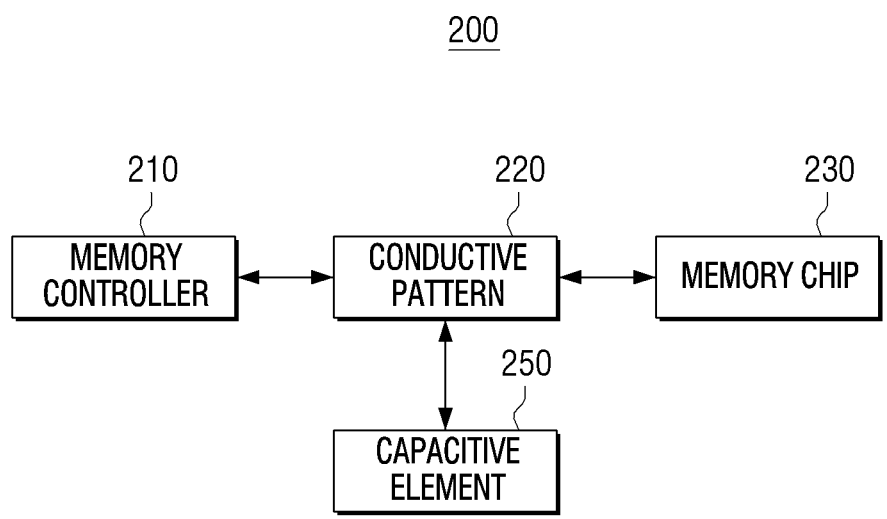
FIG. 3 is a view illustrating a configuration of an electronic apparatus according to an example.

FIG. 3 is a view illustrating a configuration of an electronic apparatus according to an example.

For example, FIG. 3 is a view illustrating a portion related to the volatile memory among the configuration of the processor in FIG. 1. Therefore, the configuration of FIG. 3 may be applied to the memory of FIG. 1 as well as to an electronic apparatus having a configuration different from that of the electronic apparatus of FIG. 1.

Referring to FIG. 3, the electronic apparatus 200 may include a memory controller 210, a conductive pattern 220, a memory chip 230, and a capacitive element 250.

The memory controller 210 may manage data transmitted and received to and from the memory chip 230. The memory controller 210 may be implemented as a separate IC separated from a CPU, and thus read and write data to the memory chip according to a request of the CPU, or may be a system on chip (SoC) integrated with the CPU function. When the memory controller 210 is the SoC integrated with the function of the CPU, the memory controller 210 may also perform the function of the processor 160 described with reference to FIG. 1.

The memory controller 210 may control an operation of the memory chip 230 (or base memory). For example, the memory controller 210 may be disposed on a circuit board on which the memory chip 230 is disposed, and may generate various signals and control signals for reading data stored in the memory chip 230 or writing data to the memory chip 230 to transmit or receive through the conductive pattern 220 disposed on the circuit board.

The various signals may refer to command signals such as an address group, a bank address group, a column access strobe (CAS), a row address strobe (RAS), a write enable (WE) or the like, and control signals such as a chip select (CS), an on die (OTT), on die termination (ODT), a clock enable (CKE), or the like.

In addition, the memory controller 210 may generate a control signal based on an operating frequency of the memory chip 230 and transmit the control signal to a control line. In this case, when the electronic apparatus 200 includes a plurality of memory chips and the operating frequencies of the respective memory chips are different, the control signal may be generated based on the slowest operating frequency.

The conductive pattern 220 may be a conductive pattern for electrically connecting the memory controller 210 and the memory chip 230, and may be disposed on a circuit board. The conductive pattern 220 may include a plurality of control lines transmitting a control signal.

The control line may be disposed between the memory controller 210 and one memory chip 230, and may be sequentially connected to the plurality of memory chips in a fly by topology manner.

In addition, the conductive pattern 220 may further include a data transmission/reception line for transmitting and receiving various signals between the memory controller 210 and the memory chip 230.

The memory chip 230 (or base memory) may be mounted on a circuit board. The memory chip may be a memory chip supporting a DDR3-1320 specification, a DDR3-1333 specification, a DDR3/4-1600 specification, a DDR3/4-1866 specification, a DDR3/4-2133 specification, a DDR4-2666 specification, and a DDR4-3200 specification, for example. The above-described specifications are merely examples, and other memory chips supporting other sizes may be used.

In addition, the electronic apparatus 200 may include a plurality of memory chips. In this case, the plurality of memory chips may constitute one rank. In addition, the electronic apparatus 200 may include a plurality of ranks. For example, the plurality of memory chips may be configured as two, four, eight, sixteen, or thirty-two, and may be connected in a 32-bit form or in a 64-bit form.

The capacitive element 250 (or shunt capacitor) may improve an impedance characteristic of the control line so that the control signal transmitted through the control line does not invade an eye mask.

To this end, the capacitive element 250 may have a termination voltage (i.e., the control signal's maximum voltage and an intermediate voltage of a minimum voltage). In this case, the termination voltage may serve to "precharge" the control line (or a transmission line) and may be half the size of a driving voltage (Vdd) of the memory chip.

Since the capacitive element has the termination voltage, the control signal has an effect capable of fast transition to the maximum voltage or the minimum voltage. The termination voltage may be disposed on a power plane disposed in an outermost layer of the circuit board.

In addition, the capacitive element 250 may be connected to an end of the control line (i.e., an opposite terminal of a terminal to which the memory controller is connected) through a termination resistor (Rtt). Meanwhile, when a plurality of control lines are included in the conductive pattern, the capacitive elements may be plural.

The capacitive element 250 may be disposed in the outermost layer of the circuit board and may be disposed in the outer region of the circuit board.

In the structure of DDR3 and DD4 memory connections, each control line is connected to a capacitive element that provides resistor and termination voltage. For example, since the resistive and capacitive elements for providing the termination voltage occupy a large area, a removal of the resistor and the termination voltage may be considered for an efficiency of wire.

However, if the resistive and capacitive elements are removed from the control line collectively, some signal qualities may cause a malfunction of the electronic apparatus due to signal reflection noise.

Therefore, conditions for selecting a control line which may remove the resistor and the capacitive element at the end of the control line will be described below.

For example, in the case where a wire length between the memory controller and the memory chip is less than a predetermined length, a malfunction will not occur even if no series resistor and termination voltage are provided. The predetermined length may be the following equation 1.

$$\text{Predetermined length} = \frac{\lambda}{8} = \frac{c}{8 \times F} \qquad \text{[equation 1]}$$

Here, $\lambda$ is a length of one cycle (for example, a wave corresponding to an operating frequency of the memory chip), C is a speed of light, and F is an operating frequency of the control signal. Meanwhile, when implementing, a length value reflecting a predetermined ratio (for example, 95%) may be used in the above equation to manage risk factor.

In this regard, in the disclosure, control lines satisfying the above conditions among the control lines between the memory controller and the memory chip are not connected to the capacitive element, and control lines not satisfying the following conditions are connected to the capacitive element.

For example, a control line having a longer wire length between the memory controller and a first memory chip disposed first than the predetermined length may be connected to the capacitive element, and a control line shorter than the predetermined length may not be connected to the capacitive element.

The wire length refers to a distance between two ports to which the control line is connected, and may refer to a distance between a port of a first memory chip disposed adjacent to the memory controller and a port of the memory controller when a plurality of memory chips are connected in a fly by topology manner.

Hereinafter, for convenience of description, when the terminal voltage is connected because the distance between the two ports is greater than or equal to the predetermined length, it is referred to as a first control line, and when the terminal voltage is not connected because the distance between the two ports is less than the predetermined length, it is referred to as a second control line.

For example, the operating frequency of a clock signal is 933.333 MHz, and a predetermined length of the control line for transmitting and receiving the control signal operating at a multiplier of a clock signal may be 160.71 mm. Accordingly, if the wire length between the port of the memory controller transmitting and receiving the corresponding control signal and the port of the memory chip is 160.71 mm or more, the resistor and the termination voltage are designed to be connected, and when the wire length is less than 160.71 mm, the wire may be designed such that resistor and termination voltages are not connected.

Meanwhile, when a plurality of memory chips of the electronic apparatus 200 are connected in the fly by topology manner, a wire length between the memory controller and a first memory chip disposed first among the plurality of memory chips may be compared to the predetermined length. Accordingly, the control line having a longer wire length between the memory controller and the first memory chip disposed first than the predetermined length may be the first control line.

In addition, the second control line may be a control line having a shorter wire length between the memory controller and the first memory chip disposed first among the plurality of memory chips than the predetermined length.

Since the predetermined length is influenced by the operating frequency of the control signal, a connection of the capacitive element may be implemented or may not be implemented even when having the same wire length, depending on which operating frequency the control signal transmits and receives. This matter will be described later with reference to FIG. 5.

Meanwhile, in a design process of the memory chip, the wire design may be performed so that the wire length of as many control lines as possible is smaller than a predetermined length value corresponding to each control line, based on the above-described predetermined length value.

As described above, the electronic apparatus 200 according to the examples does not provide the termination voltage to the control line capable of normal operation even without providing the termination voltage. In other words, the resistor and capacitor for providing the termination voltage can be omitted while maintaining the same performance compared to the related art, thereby reducing manufacturing costs and securing additional space.

Meanwhile, in FIG. 3, the memory chips are all disposed (or installed) on the circuit board, but when implementing, a socket may be disposed on the circuit board, and it may be implemented in a form in which a memory module on which the memory chip is disposed may be mounted on the socket.

In this case, the first control line described above may be connected to one of a plurality of terminals of the socket, and the second control line may be connected to the other one of the plurality of terminals of the socket. In this case, the predetermined length described above may be a distance between the memory controller and the memory chip on the memory module through the socket.

In addition, some memory chips may be directly mounted on the circuit board and the remaining memory chips may be implemented in the form of being connected through the socket.

Meanwhile, in FIG. 3, it is described that the terminal voltage is provided to the control line to maintain a signal quality, and a resistor Rs may be connected to the control line when implementing. In other words, it may be implemented in a form in which a damping resistor is connected to the corresponding control line without providing the termination voltage for the control line longer than the predetermined length. The damping resistor may be connected in series between the memory controller and the memory chip (for example, the first memory chip).

Figure 4:
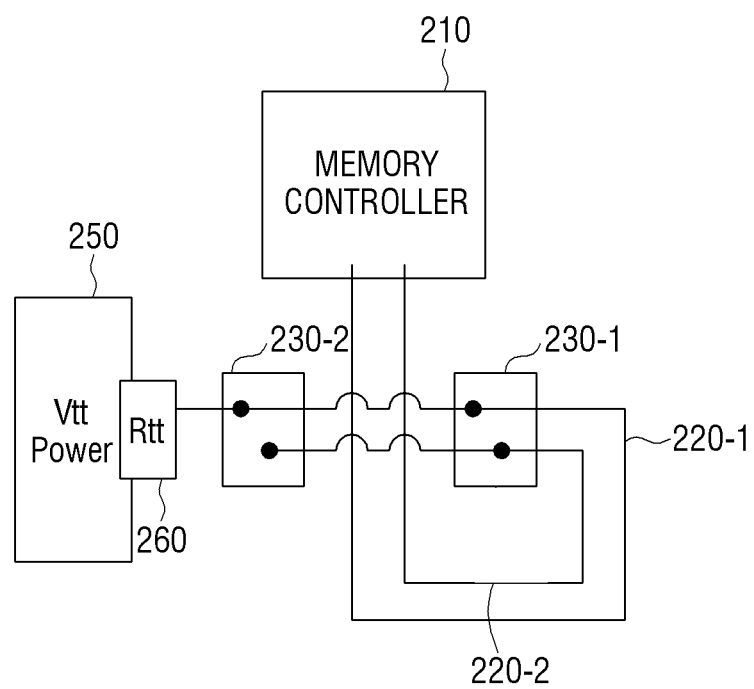
FIG. 4 is a view illustrating an example of a circuit board of an electronic apparatus.

FIG. 4 is a view illustrating an example of a circuit board of an electronic apparatus.

Referring to FIG. 4, a memory controller 210, a plurality of memory chips 230-1 and 230-2, a resistor 260, and a capacitive element 250 may be disposed on a circuit board (or main board).

The circuit board is a printed circuit board (PCB) on which components such as the memory controller 210, the memory chip 230, etc. are mounted. The circuit board 105 may be a single sided substrate or a double sided substrate having a conductive layer on both sides. As another example, the circuit board may be a multilayer board including a power supply layer, a signal layer, or the like in the circuit board.

The memory controller 210, the plurality of memory chips 230, the resistor 260, and the capacitive element 250 may be disposed in a predetermined region of the circuit board 105, respectively. The resistor and capacitive elements may be disposed in an outer region (or an edge region) of the circuit board 105.

In addition, a socket (not shown) for being connected to the memory module may be disposed on the circuit board.

Control lines 220-1 and 220-2 may be sequentially connected to the plurality of memory chips 230-1 and 230-2, respectively, starting from an output terminal of the memory controller 210. In other words, the control line may connect the plurality of memory chips in the form of fly by topology.

For example, the first control line 220-1 may have a distance between the port of the memory controller 210 and a first memory chip 230-1, which is greater than a predetermined length, and thus an end of the first control line 220-1 may be connected to the termination voltage through the resistor Rtt 260.

However, since the second control line 220-2 may have distance between the port of the memory controller 210 and the first memory chip 230-1 which is less than the predetermined length, one end may be connected to the port of the memory controller 210 and may be sequentially connected to the port of the first memory chip 230-1 and the port of the second memory chip 230-2 without being connected to the termination voltage through the resistor Rtt 260.

As such, some of the plurality of control lines do not need to be connected to an end voltage, that is, resistor and capacitive elements for providing the end voltage to the corresponding control line are not needed, thereby reducing manufacturing costs and securing spaces where the corresponding resistor and capacitive elements occupy.

Figure 5:
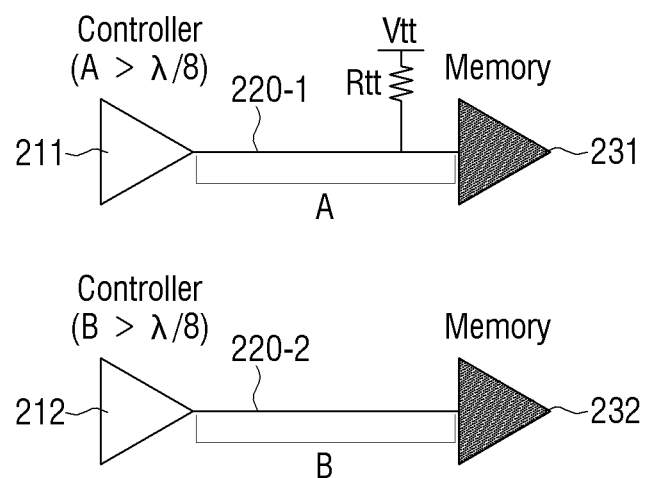
FIG. 5 is a view illustrating a connection form of a control line according to an example.

FIG. 5 is a view illustrating a connection form of a control line according to an example. For example, FIG. 5 illustrates an example in which one memory chip is connected to the memory controller.

Referring to FIG. 5, each of the memory controller and the memory chip may include a plurality of ports 211, 212, 231, and 232. The conductive pattern may include a plurality of control lines A and B for connecting the plurality of ports described above. At least one of the plurality of control lines A and B may be the first control line 220-1, and the other may include the second control line 220-2.

For example, the memory controller and the memory chip may provide each of a first control signal and a second control signal having the same operating frequency to an A control line and a B control line having different wire lengths. In such a case, when wires between ports 211 and 231 of the A control line are longer than the distance according to the equation 1 (A>$\lambda$/8), the A control line, as illustrated in FIG. 5, may be the first control line 220-1 in which the 'resistor Rtt connected to a termination voltage Vtt' is connected to the termination.

On the contrary, when the wires between ports 212 and 232 of the B control line are shorter than the distance according to the equation 1 (B<$\lambda$/8), the B control line may be the second control line 220-2 not connected to the termination as illustrated in FIG. 5.

Meanwhile, as described above, the two control lines have different lengths so that it becomes the first control line and the second control line, respectively. However, even when the two control lines have the same length, it may become the first control line and the second control line.

For example, when a distance of the A control line and a distance of the B control line are 100 mm or when the first control signal operates at a three multiplier of an operating frequency (e.g., 933.333 Mhz) and the second control signal operates at one multiplier of the operating frequency, a predetermined length for the A control line may be 53.57 mm and a predetermined length for the B control line may be 160.71 mm.

In other words, the A control line has a longer distance (100 mm-53.57 mm) than the predetermined length, and may be the first control line 220-1 provided with the termination voltage. The B control line has a shorter distance (100 mm<160.71 mm) than the predetermined length, and may be the second control line 220-2 without being provided with the termination voltage.

Figure 6:
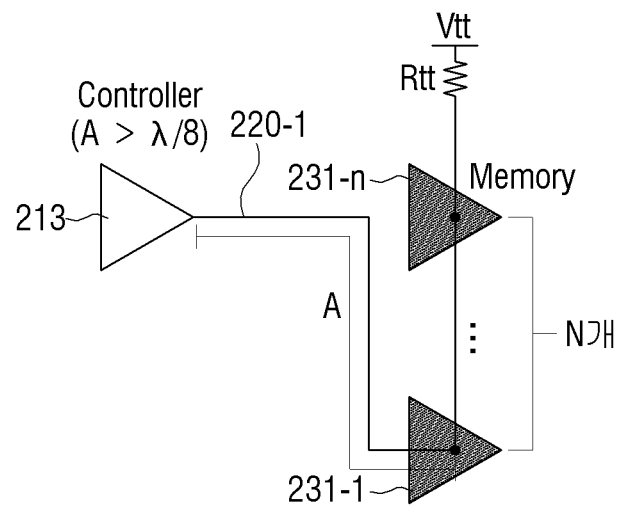
FIG. 6 is a view illustrating a connection form of a control line according to an example.
Figure 6:
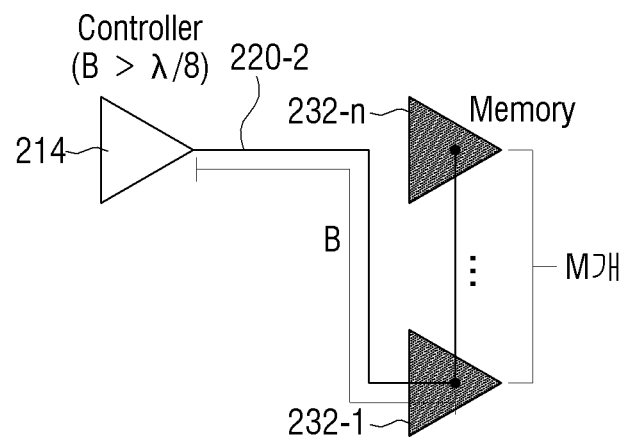

FIG. 6 is a view illustrating a connection form of a control line according to an example. For example, FIG. 6 illustrates an example in which a plurality of memory chips are connected to the memory controller 210 in the form of a fly to topology Referring to FIG. 6, the memory controller and the memory chip may include a plurality of ports 213, 214, 231-1, . . . , 231-n, 232-1, . . . , 231-m. The conductive pattern may include a plurality of control lines A and B for connecting the plurality of ports described above. At least one of the plurality of control lines A and B may be the first control line 220-1, and the other may include the second control line 220-2.

For example, it is assumed that a third control signal is provided through a third port 213 of the memory controller and a fourth control signal is provided through a fourth port 214 to the plurality of memory chips.

In this case, if a wire length between the third port 213 of the memory controller and a port 231-1 of the first memory chip is longer than the distance according to the equation 1 described above (A>λ/8), the A control line may be a first control line 220-1 connected to a resistor connected to the termination voltage at a terminal.

Figure 7:
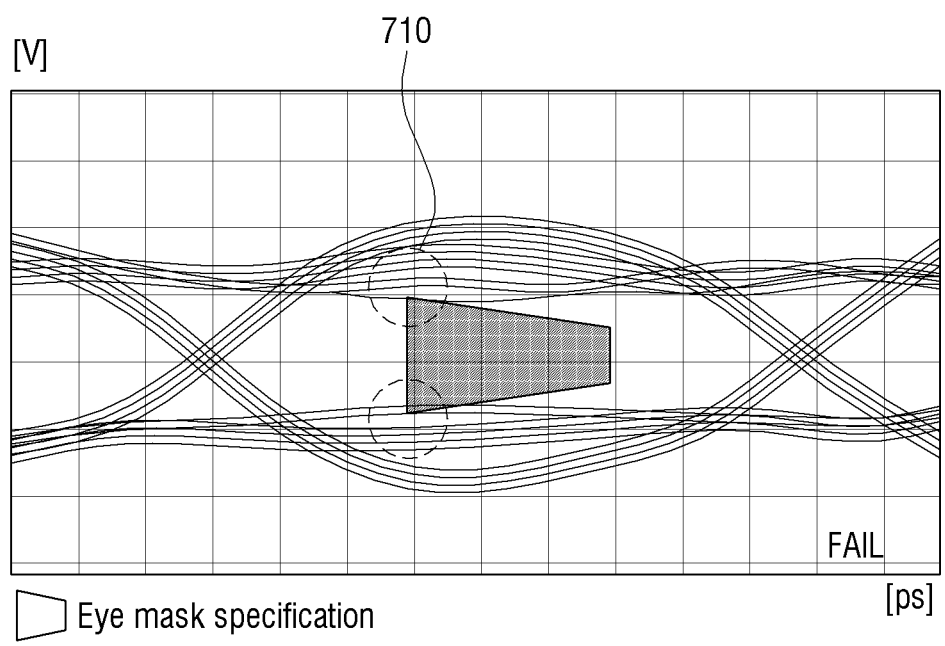
FIG. 7 is an eye diagram of a case of being disposed by being spaced apart over a predetermined length and no termination voltage is provided.
Figure 8:
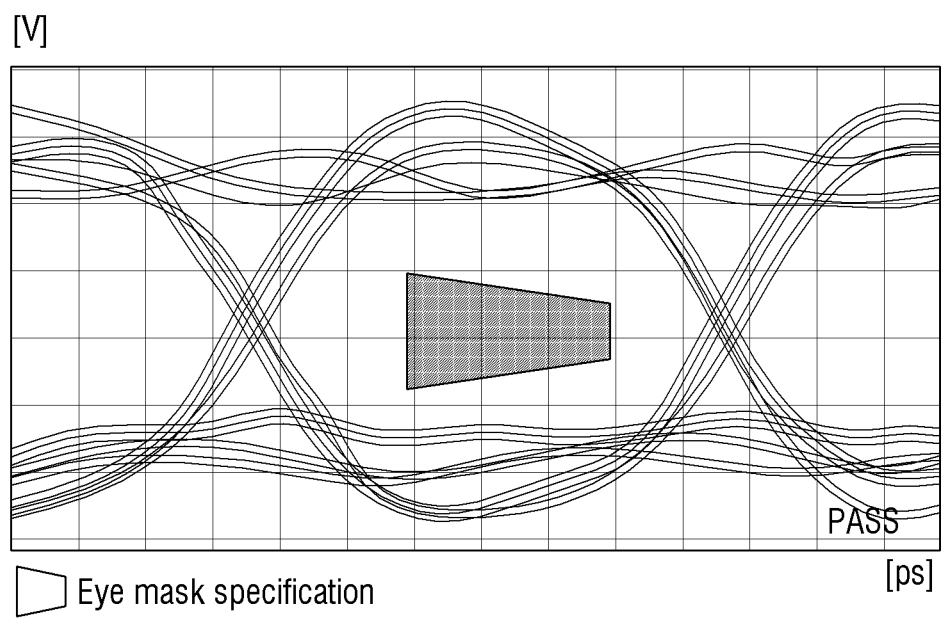
FIG. 8 is an eye diagram of a case of being disposed below a predetermined length and no termination voltage is provided.

On the contrary, if a wire length between the fourth port 214 of the memory controller and a port 232-1 of the first memory chip is shorter than the distance according to the equation 1 described above (B<λ/8), the B control line may be the second control line 220-2 not connected to the termination voltage at the terminal FIG. 7 is an eye diagram of a case of being disposed by being spaced apart over a predetermined length and no termination voltage is provided, and FIG. 8 is an eye diagram of a case of being disposed below a predetermined length and no termination voltage is provided.

Referring to FIG. 7, when a length of the control line is greater than or equal to a predetermined length, a failure may occur in a system operation by touching the eye mask specification.

Referring to FIG. 8, when a length of the control line is less than the predetermined length, a failure may not occur because the mask specification is not touched even if a termination voltage is not provided as the same.

As described above, the electronic apparatus according to the disclosure may not perform or include a design for providing the termination voltage when the wire length of the control line satisfies a predetermined condition, thereby securing additional space and reducing material costs.

The foregoing examples are merely examples and are not to be construed as limiting the disclosure. The disclosure can be readily applied to other types of apparatuses. Also, the description of the examples of the disclosure is intended to be illustrative, and not to limit the scope of the claims, and many alternatives, modifications, and variations may be made to the examples described herein.

What is claimed is:

1. An electronic apparatus, comprising:
    a memory chip;
    a memory controller to control an operation of the memory chip;
    a capacitive element to provide a termination voltage; and
    a conductive pattern including:
        a first control line having a first wire length longer than a predetermined length to connect from a first terminal of the memory controller to a first terminal of the memory chip, and connected to the capacitive element, and
        a second control line having a second wire length shorter than the predetermined length to connect from a second terminal of the memory controller to a second terminal of the memory chip, without being connected to the capacitive element;
    wherein the predetermined length is based on an operating frequency of the memory chip and an operating frequency of a control signal generated by the memory controller.

2. The electronic apparatus as claimed in claim 1, wherein the predetermined length is determined according to the following equation:

$$C/(8*F)$$

wherein C is a speed of light and F is the operating frequency of the control signal.

3. The electronic apparatus as claimed in claim 1, wherein the first control line is connected to the capacitive element through a resistor.

4. The electronic apparatus as claimed in claim 1, wherein the second control line is to connect from the second terminal of the memory controller to the second terminal of the memory chip, without being connected to a resistor.

5. The electronic apparatus as claimed in claim 1, wherein
    the electronic apparatus includes a plurality of memory chips,
    the first control line is sequentially connected to first terminals of the plurality of memory chips, respectively, from the first terminal of the memory controller, and
    the second control line is sequentially connected to second terminals of the plurality of memory chips, respectively, from the second terminal of the memory controller.

6. The electronic apparatus as claimed in claim 5, wherein
    a wire length of the first control line between the memory controller and a first memory chip among the plurality of memory chips is longer than the predetermined length, and
    a wire length of the second control line between the memory controller and the first memory chip is shorter than the predetermined length.

7. The electronic apparatus as claimed in claim 5, wherein the first control line and the second control line each transmit a control signal to control the plurality of memory chips.

8. The electronic apparatus as claimed in claim 7, wherein the control signal comprises at least one signal among a bank address group, a column access strobe signal, a row address strobe signal, a write enable signal, a chip select signal, an on die termination signal, or a clock enable signal.

9. The electronic apparatus as claimed in claim 7, wherein the control signal is sequentially provided to the plurality of memory chips, respectively.

10. The electronic apparatus as claimed in claim 5, wherein the plurality of memory chips are one of two memory chips, four memory chips, eight memory chips, sixteen memory chips, or thirty-two memory chips.

11. The electronic apparatus as claimed in claim 5, further comprising:
- a memory module on which the plurality of memory chips are disposed; and
- a circuit board provided with a socket including a plurality of terminals electronically connected to the memory module, and
- wherein the first control line is connected to one of the plurality of terminals of the socket and the second control line is connected to another one of the plurality of terminals of the socket.

12. The electronic apparatus as claimed in claim 1, wherein
- the electronic apparatus includes a plurality of capacitive elements,
- the conductive pattern includes a plurality of first control lines, and
- each of the plurality of first control lines is connected to a respective capacitive element among the plurality of capacitive elements.

13. The electronic apparatus as claimed in claim 1, wherein the termination voltage is half of a driving voltage of the memory chip.

14. An image forming apparatus, comprising:
- a memory to store image data;
- a processor to perform a control for the image forming apparatus to perform an image forming job with respect to the image data, and
- wherein the memory includes:
  - a memory chip,
  - a capacitive element to provide a termination voltage;
- a memory controller to control an operation of the memory chip; and
- a conductive pattern including:
  - a first control line having a first wire length longer than a predetermined length to connect from a first terminal of the processor to a first terminal of the memory chip, and connected to the capacitive element, and
  - a second control line having a second wire length shorter than the predetermined length to connect from a second terminal of the processor to a second terminal of the memory chip, without being connected to the capacitive element;
- wherein the predetermined length is based on an operating frequency of the memory chip and an operating frequency of a control signal generated by the memory controller.

* * * * *